(12) United States Patent
Yi et al.

(10) Patent No.: US 8,573,579 B2
(45) Date of Patent: Nov. 5, 2013

(54) BIASING A PRE-METALIZED NON-CONDUCTIVE SUBSTRATE

(75) Inventors: Chang Bok Yi, Fremont, CA (US);
Tatsuru Tanaka, Campbell, CA (US);
Chun Wai Joseph Tong, San Jose, CA (US); Hongling Liu, Sunnyvale, CA (US); Paul S. McLeod, Berkeley, CA (US)

(73) Assignee: Seagate Technology LLC, Cupertino, CA (US)

( * ) Notice: Subject to any disclaimer, the term of this patent is extended or adjusted under 35 U.S.C. 154(b) by 594 days.

(21) Appl. No.: 12/715,144

(22) Filed: Mar. 1, 2010

(65) Prior Publication Data

US 2011/0212269 A1    Sep. 1, 2011

(51) Int. Cl.
*B25B 5/16*    (2006.01)

(52) U.S. Cl.
USPC ........................................ 269/254 CS; 269/21

(58) Field of Classification Search
USPC ........... 269/254 CS, 903, 24, 32, 63, 70, 215, 269/254 R, 21; 427/458, 331, 404
See application file for complete search history.

(56) References Cited

U.S. PATENT DOCUMENTS

| | | | |
|---|---|---|---|
| 4,749,465 A | 6/1988 | Flint et al. ..................... 204/298 |
| 5,800,661 A * | 9/1998 | Reis et al. ..................... 156/285 |
| 5,906,363 A * | 5/1999 | Reis et al. ........................ 269/21 |
| 5,939,202 A | 8/1999 | Ataka et al. ................... 428/457 |
| 6,120,661 A | 9/2000 | Hirano et al. ............. 204/298.15 |
| 6,228,429 B1 * | 5/2001 | Bluck et al. .................... 427/331 |
| 6,526,909 B1 | 3/2003 | Grannen et al. ............... 118/723 |
| 6,749,729 B1 | 6/2004 | Xu et al. |
| 7,041,202 B2 | 5/2006 | McLeod .................. 204/192.12 |
| 7,195,808 B2 | 3/2007 | Yi ................................. 428/66.5 |
| 2006/0032050 A1 | 2/2006 | Canella |
| 2006/0180465 A1 | 8/2006 | Mavliev et al. |
| 2010/0089621 A1 * | 4/2010 | Stoss et al. ..................... 174/254 |
| 2011/0212269 A1 * | 9/2011 | Yi et al. ......................... 427/458 |
| 2012/0315825 A1 * | 12/2012 | Baccini et al. .................. 451/28 |

FOREIGN PATENT DOCUMENTS

| CN | 1801335 A | 7/2006 |
|---|---|---|
| JP | 2002-319125 A | 2/2002 |

OTHER PUBLICATIONS

Search and Exam Report, SG application 20110866-1, mailed Oct. 26, 2012.

* cited by examiner

*Primary Examiner* — Lee D Wilson

(57) ABSTRACT

Methods and apparatus are provided for static-biasing a pre-metalized non-conductive substrate within a process chamber. A substrate holder that holds a pre-metalized non-conductive substrate is engaged by a lift mechanism that provides movement of the substrate in a first, upward direction to a contact position within the process chamber and in a second direction to a non-contact position. When the substrate holder is moved to the contact position, the substrate electrically engages a conductive spring-loaded compliance mechanism that is mounted in a fixed position within the process chamber. The spring-loaded compliance mechanism is connected to a bias-voltage feed-through for the process chamber that applies a bias voltage to the substrate via the spring-loaded compliance mechanism.

20 Claims, 4 Drawing Sheets

BIASING A PRE-METALIZED NON-CONDUCTIVE SUBSTRATE

FIELD OF THE INVENTION

The present invention relates to methods and apparatus for processing substrates and, in particular, to methods and apparatus for biasing pre-metalized non-conductive substrates, such as glass substrates utilized for magnetic discs.

BACKGROUND OF THE INVENTION

Magnetic discs have typically been fabricated on conductive metal substrates. During formation of some or all of the multiple layers of the magnetic medium on the conductive substrate, a bias voltage is applied to the substrate while it is positioned in a processing chamber. Biasing the substrate causes ions within the processing chamber to be accelerated toward the substrate. Depending upon the particular process used, the acceleration of ions toward the substrate surface increases the material deposition rate on the substrate in comparison with an unbiased substrate, modifies the substrate surface by ion bombardment, or produces other desirable effects.

In the case of a conductive substrate, the bias voltage may be applied to the substrate through conductive fingers that physically hold the substrate in position for processing. For example, FIG. 1 shows a three-finger substrate holder 100 that supports a substrate 102. The substrate holder 100 includes a holder body 104 and three conductive support rods 106, 108 and 110 that extend from the holder body 104 to make contact with the edge of the substrate 102. Although not specifically shown in FIG. 1, the support rods 106, 108 and 110 typically terminate in a V-shape or forked-shape to provide stability for the substrate 102 during transport and processing.

It is becoming increasingly desirable to use non-conductive substrates in some applications. For example, glass substrates are utilized in the fabrication of magnetic discs for laptop computers because of their light weight and durability. However, a problem arises in the processing of non-conductive substrates because the substrate cannot be biased by application of a voltage in the same way as in the processing of conductive substrates. As mentioned above, in the processing of conductive substrates, the bias voltage can be applied to the substrate though the support rods of the substrate holder. However, this has not proven practical in the case of non-conductive substrates due to the fact that the V-shaped or fork-shaped support rods of the substrate holder that hold the non-conductive substrate erect for processing shadow the area of the substrate adjacent to the support rods. This shadowing prevents a conductive layer from building up adjacent to the rods and, thus, prevents the formation of a conductive path between the support rods and the conductive film being formed on the non-conductive substrate. Thus, the same electrical path used in the case of conductive substrates (conductive support rods to disc) cannot be used with non-conductive substrates. In the case of non-conductive substrates, this problem may be overcome by rotating the substrate during processing to make sure that the support rods do not shadow the formation of conductive layers adjacent the rods. However, substrate rotating mechanisms generally occupy one process station on a sputter tool having a limited number of processing stations, thereby decreasing the processing efficiency of the tool, and ultimately resulting in higher processing costs per disc.

Accordingly, there is a need for improved apparatus and methods for processing non-conductive substrates so that the non-conductive substrate can be electrically biased to enhance substrate processing steps.

SUMMARY OF THE INVENTION

An embodiment of an apparatus for biasing a pre-metalized non-conductive substrate within a vacuum process chamber in accordance with the concepts of the present invention comprises: a substrate holder adapted for holding the substrate, a lift mechanism that engages the substrate holder to move the substrate holder in a first direction to a contact position within the process chamber and in a second direction to a non-contact position, and a spring-loaded compliance mechanism mounted in a fixed position within the process chamber. The spring-loaded compliance mechanism electrically engages the pre-metalized substrate when the substrate holder is in the contact position. The spring-loaded compliance mechanism is connected to a bias voltage feed-through for the process chamber such that the bias voltage feed-through applies a bias voltage to the pre-metalized non-conductive substrate via the spring-loaded compliance mechanism when the substrate holder is in the contact position. The spring-biased compliance mechanism is described herein with reference to two exemplary embodiments. In a first embodiment, at least one conductive leaf spring contact is provided in a bias plate so that the leaf spring contact engages the metalized layer on the substrate when the substrate holder is in the contact position. In a second embodiment, a spring-loaded compliance mechanism brings a conductive top radial contactor into electrical contact with a metalized layer on the substrate when the substrate holder is in the contact position. In each of these embodiments, the spring-loaded compliance mechanism is fixedly mounted within the vacuum process chamber so that the substrate holder is brought into contact with the spring-loaded compliance mechanism inside the process chamber, rather than the spring-loaded compliance mechanism being made part of the substrate holder that is moved into and out of the process chamber.

An embodiment of a method of biasing a pre-metalized non-conductive substrate within a vacuum process chamber in accordance with the concepts of the present invention comprises: providing a conductive spring-loaded compliance mechanism mounted in a fixed position within the process chamber, the compliance mechanism being adapted for connection to a bias voltage feed-through for the process chamber; and moving the pre-metalized non-conductive substrate into electrical engagement with the spring-loaded compliance mechanism such that the bias voltage feed-through applies a bias voltage to the pre-metalized substrate in the process chamber via the spring-loaded compliance mechanism.

Additional features and advantages of the present invention will become readily apparent to those skilled in the art from the following detailed description of the invention, wherein embodiments are shown and described by way of illustration. As will be realized by those skilled in the art, the invention is capable of other and different embodiments, and its several details are capable of modification in various respects, all without departing from the scope of the present invention. Accordingly, the drawings and description provided herein should be regarded as illustrative, not restrictive.

DETAILED DESCRIPTION OF THE INVENTION

Figure 1:
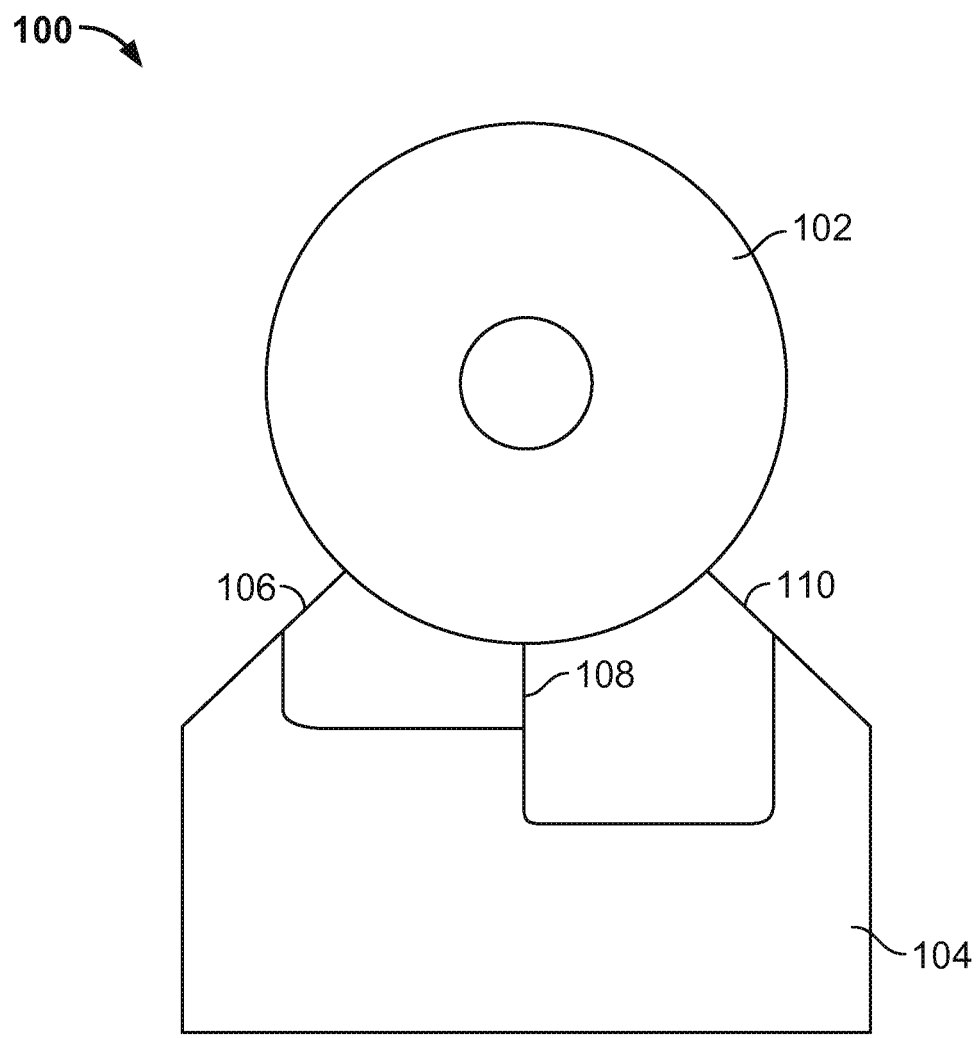
FIG. 1 is a front, side view drawing illustrating a conventional substrate holder.

Embodiments of the present invention provide methods and apparatus for static-biasing a pre-metalized non-conductive substrate such as, for example, a ceramic substrate or a glass substrate of the type utilized in fabricating magnetic media. A lift mechanism that provides up and down motion engages a substrate holder adapted for holding the substrate. An example of such a lift mechanism is disclosed in U.S. Pat. No. 6,228,429 B1, herein incorporated by reference. The lift mechanism operates to move the substrate holder in a first, upward direction to a contact position within a vacuum process chamber and in a second, downward direction to a non-contact position. When the substrate holder is in the contact position, the pre-metalized non-conductive substrate electrically engages a conductive spring-loaded compliance mechanism that is mounted in a fixed position within the process chamber. The spring-loaded compliance mechanism is connected to a bias voltage feed-through for the process chamber that provides a bias voltage to the substrate via the spring-loaded compliance mechanism when the substrate holder is in the contact position within the process chamber.

The term "pre-metalized non-conductive substrate" as used herein is intended to encompass any non-conductive substrate (e.g., ceramic, glass) that includes at least one continuous layer of conductive film. For example, as stated above, the use of non-conductive substrates (e.g., glass substrates) is becoming increasingly popular in the manufacture of magnetic discs. As is well known to those of ordinary skill in the art, magnetic discs typically comprise a substrate and a plurality of thin film layers that are successively formed over the substrate, including a crystalline underlayer, a multi-layered magnetic film and a protective carbon overcoat layer. Typically, the substrate is first plated with an alloy, such as nickel/phosphorous alloy, to achieve a requisite surface hardness. The crystalline underlayer is preferably sputtered chromium; chromium-containing alloys, such as CrV, CrGd and CrSi may also be suitable underlayer materials, as may tungsten. The layers of the magnetic film are preferably formed of a cobalt-based alloy, that is, an alloy containing at least 50% cobalt; exemplary cobalt-based alloys include binary and ternary alloys such as Co/Cr, Co/Ni, Co/Cr/Ta, Co/Ni/Pt or Co/Cr/Ni, and quaternary and five-element alloys such as Co/Ni/Cr/Pt, Co/Cr/Ta/Pt, Co/Cr/Ta/Pt/B or Co/Cr/Ni/Pt/B. A non-magnetic isolation layer, or interlayer, may be disposed between the magnetic layers. The non-magnetic metal in the isolation layer may be Cr, Ti, Mo, Zr, Al, W, Si, Nb, Ta, Y, Hf, Au, Ag, V, B, Gd, Cu, Re or Ru. The protective overcoat layer is typically diamond-like carbon (DLC). Thus, as those skilled in the art will appreciate, the concepts of the invention are applicable at any successive stage of the formation of a thin film medium, if at least one layer of conductive material has been formed on the non-conductive substrate. For example, the initially plated nickel/phosphorous alloy would suffice for providing a pre-metalized non-conductive substrate.

As is well known to those skilled in the art, the formation of the successive layers of a magnetic medium of the type described above takes place in a sequence of process chambers, each of which performs one or more operations in the formation of the multi-layer stack. Substrate holders are utilized to move a substrate-in-process among the process chambers. Known process chambers, such as that disclosed in U.S. Pat. No. 6,228,429 B1, include a carousel mechanism for moving a substrate holder into a processing position within the process chamber. Known process chambers, such as that disclosed in U.S. Pat. No. 6,228,429 B, also include a feed-through mechanism for applying a bias voltage to a substrate-in-process that is in a processing position within a process chamber. A purpose of the present invention is to permit the routine processing of non-conductive substrates in the same manner as conductive substrates, so as to not require additional process stations that would reduce overall processing throughput. The present invention provides for the electrical biasing of the non-conductive substrate so that the non-conductive substrate can be processed with electrical biasing in the same way that conductive substrates are electrically biased for processing. Given that the processes, process conditions and process chamber design are well known to those of ordinary skill in the art (see, e.g., U.S. Pat. No. 6,228,429 B1), these concepts will not be further discussed in detail herein. Rather, embodiments of the present invention will now be discussed in conjunction with FIG. 2 and FIG. 3.

Figure 2:
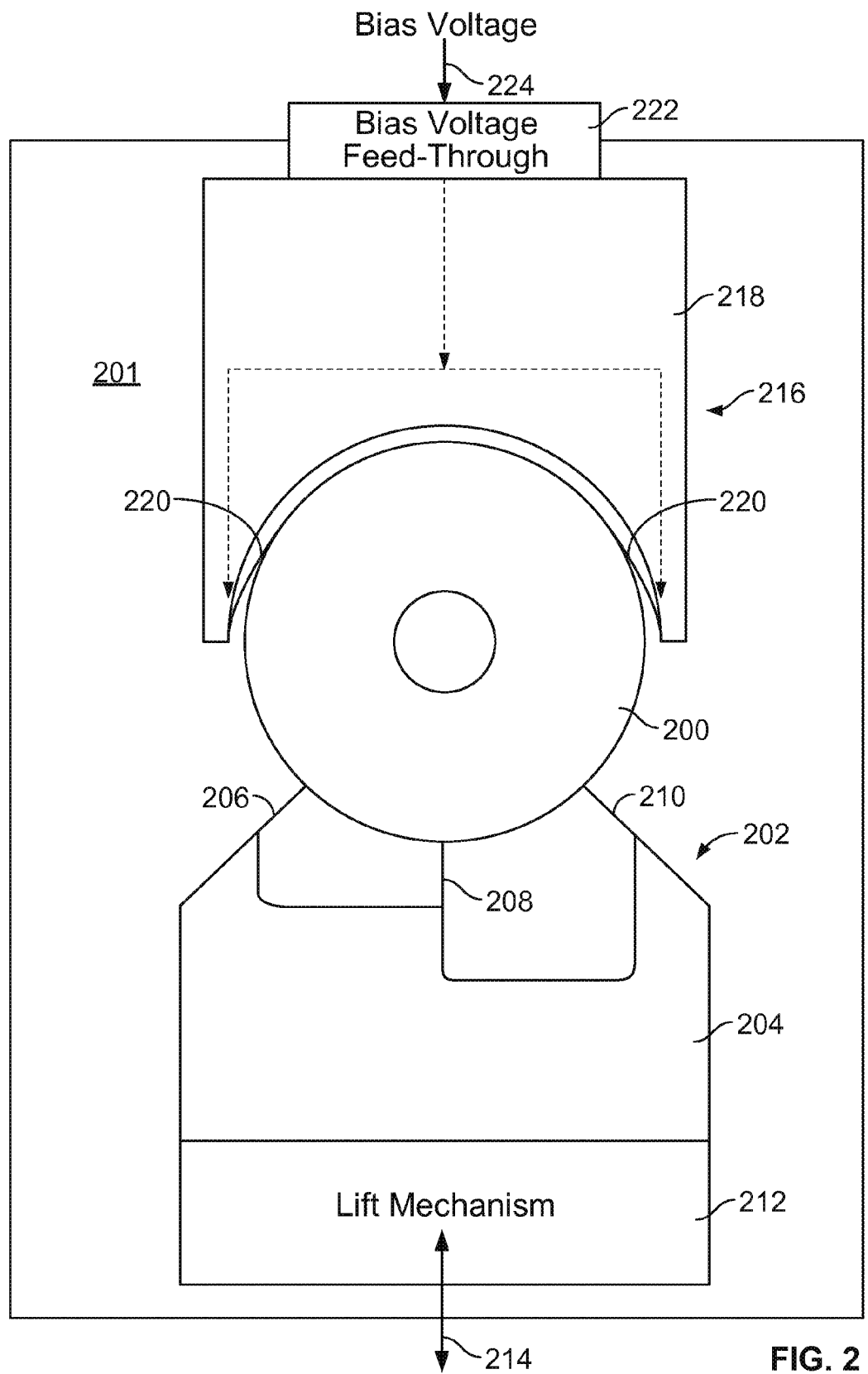
FIG. 2 is schematic drawing illustrating an embodiment of an apparatus for static biasing a pre-metalized non-conductive substrate in accordance with the concepts of the present invention.

FIG. 2 schematically shows an embodiment of an apparatus for static-biasing a pre-metalized non-conductive substrate 200 within a vacuum process chamber 201. The apparatus includes a substrate holder 202 that holds the substrate 200. The substrate holder 202 includes a holder body 204 and three support rods 206, 208 and 210 that extend from the holder body 204 to make contact with the edge of the substrate 200 in the conventional manner. A lift mechanism 212 engages the substrate holder 204 to provide movement of the substrate 200 in a first, upward direction to a contact position within the process chamber 201 and in a second, downward direction to a non-contact position, as indicated by the arrow 214 in FIG. 2. FIG. 2 shows the substrate holder 204 in the contact position. A conductive spring-loaded compliance mechanism 216 includes a bias shield 218 that is mounted in a fixed position within the process chamber 201 and conductive contact springs 220 attached to the bias shield 218; the conductive contact springs 220 are illustrated in FIG. 2 as leaf springs, although other spring contact mechanisms would be suitable. The conductive contact springs 220 electrically engage the edges of the pre-metalized substrate 200 when the substrate holder 202 is moved into the contact position by action of the lift mechanism 212. While the FIG. 2 embodiment is described with reference to two contact springs 220, only one of the contact springs 220 is necessary to establish the required electrical connection to the outer edge of the metal layer formed on the non-conductive substrate 200. An electrical feed-through 222 formed as part of the process chamber 201 in the conventional manner is connected to the spring-loaded compliance mechanism 216 and is utilized to apply a bias voltage to the substrate 200 through the contact springs 220. The conductive contact springs 220 may be BeCu about 0.005 inches thick and about 0.160 inches wide. The bias shield 218 is preferably aluminum and shields a holding bracket, electrical cable 224 and contact springs 220 from being sputtered and overcoated during processing of the substrate. The bias voltage is provided by a DC power supply and runs through the cable 224 to the conventional bias voltage feed-through 222 for the process chamber 201. The feed-through 222 brings the electrical cable 224 into the process chamber 201 and connects it to the holding bracket. The contact springs 220 are attached to the two ends of the holding bracket and deliver the bias voltage to the pre-metalized substrate 200. In the illustrated embodiment, the holding bracket is formed to provide a cut out arc having substantially the same arc radius as the substrate 200 to enable the substrate 200 to be moved into contact with the springs 220.

The lift mechanism 212 in the FIG. 2 embodiment can be of the carousel assembly type described in above-cited U.S. Pat. No. 6,228,429 B1. That is, the lift mechanism 212 can comprise a plurality of substrate holders 202 disposed in a circular arrangement within a processing unit that includes a circular arrangement of multiple vacuum process chambers 201. The substrate holders 202 in the circular arrangement are equiangularly spaced and are positioned such that they may be simultaneously raised into a respective process chamber 201. The carousel assembly is connected to a central hub and is rotatable about a central axis by an indexing motor such that each substrate holder 202 may be aligned with a respective selected process chamber 201. The carousel assembly is raised and lowered by a drive motor between a raised position and lowered position. In the raised position, the substrate holders 202 are positioned within the respective process chambers 201. For example, in the FIG. 2 embodiment, the raised position of the carousel would place the substrate holder 204 in the contact position within the process chamber 210, i.e., in a position such that the pre-metalized substrate 200 is in electrical contact with the spring-loaded compliance mechanism 216 that is mounted within the process chamber 201.

The carousel assembly described in U.S. Pat. No. 6,228,429 B1 should, however, be considered exemplary and not limiting of lift mechanisms 212 that are utilizable in conjunction with the FIG. 2 embodiment of the invention. Those skilled in the art will appreciate that other lift systems that comprise an assembly of multiple substrate holders are also suitable. In addition, the lift mechanism 212 may comprise an apparatus that includes only a single substrate holder. A common feature of lift mechanisms suitable for use in conjunction with the FIG. 2 embodiment is the ability to align a substrate holder 204 within the vacuum process chamber 201 and to impart vertical motion to the substrate holder 204 to raise it into the contact position within the process chamber 201 for electrical engagement of the pre-metalized substrate 200 with the spring-loaded compliance mechanism 216.

The bias voltage feed-through 222 is of well-known design and provides a conductive path for application of a bias voltage to the pre-metalized substrate 200 via the spring-loaded compliance mechanism 216 when the substrate holder 204 is in the contact position, as described above. The bias voltage is typically in a range of about 100-300 volts, but is not limited to this range. The bias voltage depends upon the type of process to be performed on the substrate 200 within the process chamber 201.

Figure 3:
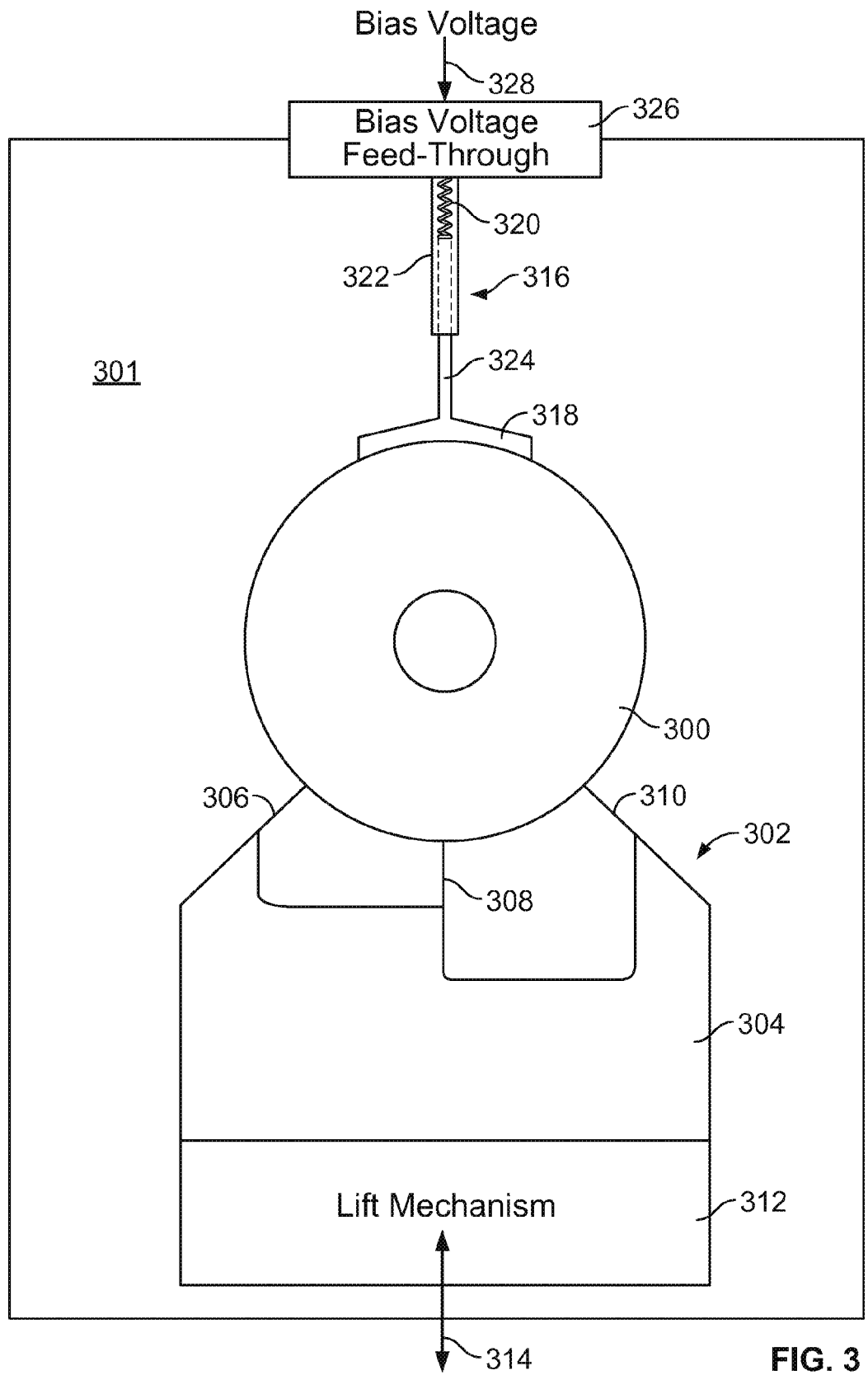
FIG. 3 is a schematic drawing illustrating an alternate embodiment of an apparatus for static biasing a pre-metalized non-conductive substrate in accordance with the concepts of the present invention.

FIG. 3 schematically shows an alternate embodiment of an apparatus for static-biasing a pre-metalized non-conductive substrate 300 within a vacuum process chamber 301. The apparatus includes a substrate holder 302 that holds the substrate 300. The substrate holder 302 includes a holder body 304 and three support rods 306, 308 and 310 that extend from the holder body 304 to make contact with the edge of the substrate 300 in the conventional manner. A lift mechanism 312 engages the substrate holder 304 to provide movement of the substrate 300 in a first, upward direction to a contact position and in a second, downward direction to a non-contact position, as indicated by the arrow 314 in FIG. 3. FIG. 3 shows the substrate holder 302 in the contact position. When the lift mechanism 312 moves the substrate holder 304 upward into the contact position, the pre-metalized substrate 300 is urged into electrical contact with a conductive spring-loaded compliance mechanism 316 that is mounted in a fixed position within the process chamber 301. In the illustrated embodiment, the spring-loaded compliance mechanism 316 includes a conductive top radial contactor 318 that makes electrical contact with the outer edge of the conductive layer formed on the non-conductive substrate 300 when the substrate holder 304 is in contact position. In the FIG. 3 embodiment, the top radial contactor 318 has substantially the same arc radius as the substrate 300. The compliance mechanism 316 also includes a spring 320 that is mounted within a sleeve 322. A push-rod 324 formed as part of the top radial contactor 318 is mounted within the sleeve 322 and engages the spring 320 such that the spring 320 maintains the proper force on the top radial contactor 318 to urge it into electrical contact with the edges of the substrate 300. When the top radial contactor 318 is in contact with the metalized edge of the substrate 300, the compliance mechanism 316 provides electrical contact between the substrate 300 and a bias feed-through 326 formed as part of the process chamber 301 in the conventional manner for application of a bias voltage 328 to the substrate 300 within the process chamber 301. The top radial contactor 318, the sleeve 322 and the push-rod 324 may all be 316 stainless steel; the spring 320 may be spring-tempered steel wire.

As in the case of the FIG. 2 embodiment, the lift mechanism 312 may be of the carousel assembly type described in the U.S. Pat. No. 6,228,429 B1. However, as in the case of the FIG. 2 embodiment, the carousel assembly of the '429 patent should be considered exemplary and not limiting. A common feature of lift mechanisms 312 suitable for use in conjunction with the FIG. 3 embodiment is the ability to align a substrate holder 304 with the vacuum process chamber 301 and to impart vertical motion to the substrate holder to raise it into the contact position with the process chamber 310 for electrical engagement of the pre-metalized substrate 300 with the spring-loaded compliance mechanism 316.

As in the case of the FIG. 2 embodiment, the bias voltage feed-through 326 is of well-known design and provides a conductive path for application of a bias voltage to the pre-metalized substrate 300 via the spring-loaded compliance mechanism 316 when the substrate holder 304 is in the contact position. The bias voltage 328 is typically in a range of about 100-300 volts, but is not limited to this range. The bias voltage 328 depends upon the type of process to be performed on the substrate 300 within the process chamber 301.

Figure 4:
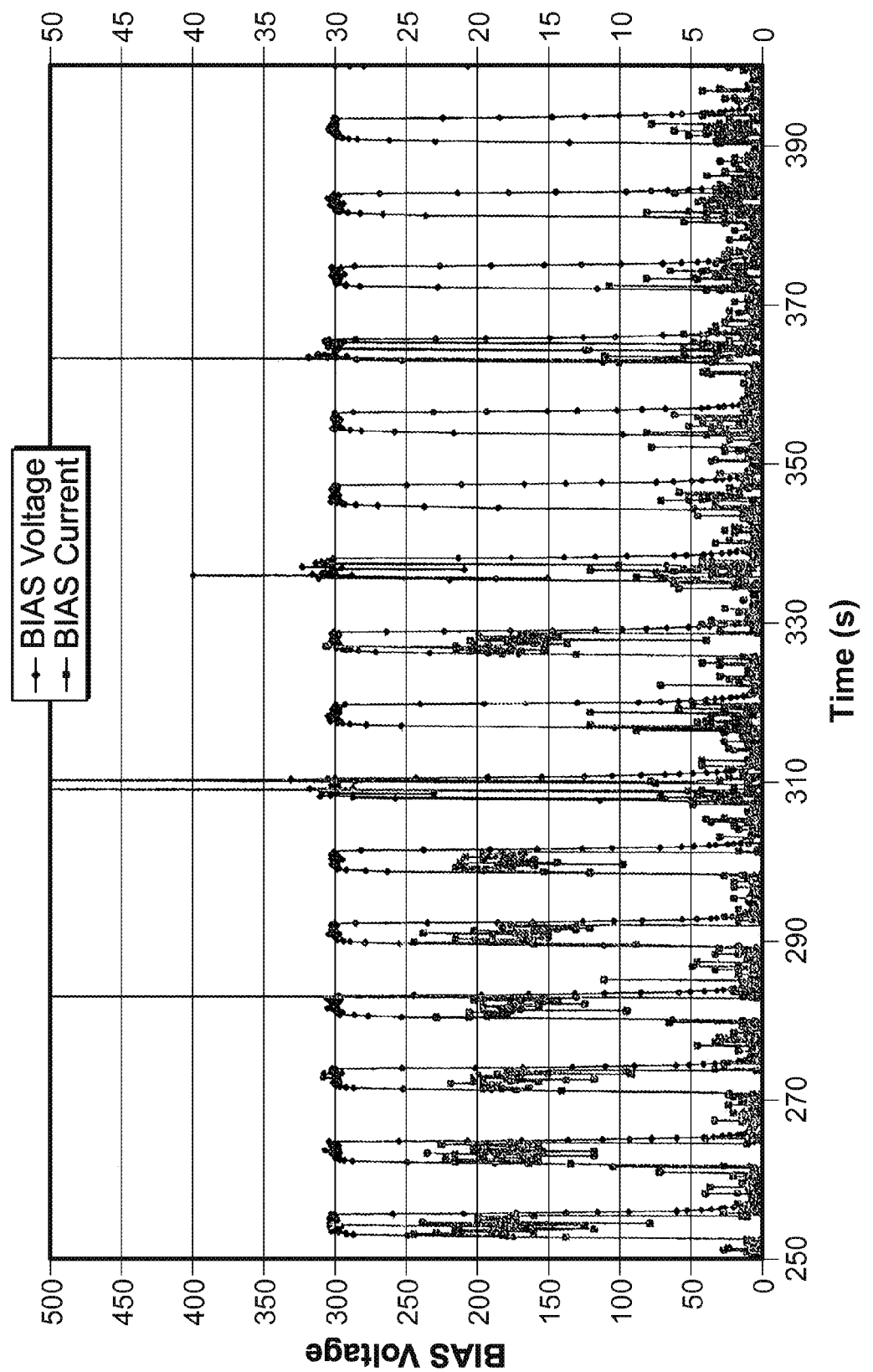
FIG. 4 is a graph plotting feed-through bias voltage and substrate bias current versus time for the FIG. 3 embodiment of the present invention.

In a test of the FIG. 3 embodiment of the invention, a fresh glass substrate was loaded into an Intevac 12-station 250B sputter system and sputtered to build up a conductive film stack 680 Å thick. The pre-metalized non-conductive substrate was then transported to a sputter process chamber that included a spring-loaded compliance mechanism mounted in a fixed position within the process chamber, as discussed above in conjunction with FIG. 3. The test conditions were as follows: sputter cathode power=1 kW, sputter cathode voltage=485V, chamber pressure=37 mTorr, feed-through bias voltage=300V. FIG. 4 shows fee-through bias voltage and substrate bias current conditions as the 300V bias voltage is cyclically applied to the pre-metalized substrate over time. As shown in FIG. 4, each cycle that the pre-metalized glass substrate made contact with the spring-loaded compliance mechanism, the substrate bias current shows ~20 mA when the 300V bias voltage was applied. Thus, the FIG. 4 data show successful static biasing of a pre-metalized glass substrate.

It should be understood that the particular embodiments of the present invention described in this application have been provided as non-limiting examples and that other modifications and variations may occur to those skilled in the art without departing from the scope of the invention as expressed in the appended claims and their equivalents.

What is claimed is:

1. An apparatus comprising:
   a substrate holder adapted for holding a pre-metalized non-conductive substrate;
   a conductive spring-loaded compliance mechanism connected to a bias voltage, wherein the conductive spring-loaded compliance mechanism is operable to apply the bias voltage to the substrate when the substrate is brought into contact with the conductive spring-loaded compliance mechanism; and
   a lift mechanism, wherein
      the lift mechanism is operable to move the substrate holder in a first direction to bring the substrate into contact with the spring-loaded compliance mechanism, thereby connecting the spring-loaded compliance mechanism through the substrate to the lift mechanism, and
      the lift mechanism is operable to move the substrate holder in a second direction to disconnect the substrate from the spring-loaded compliance mechanism, thereby disconnecting the spring loaded compliance mechanism from the lift mechanism through the substrate.

2. An apparatus as in claim 1, wherein the substrate comprises a glass substrate.

3. An apparatus as in claim 1, wherein the substrate includes a chromium-containing alloy formed on a surface thereof.

4. The apparatus of claim 1, wherein the spring-loaded compliance mechanism comprises:
   at least one conductive spring-loaded contact for engagement with the pre-metalized non-conductive substrate when the substrate is brought into contact with the spring-loaded compliance mechanism.

5. The apparatus of claim 4, wherein the at least one conductive spring-loaded contact comprises a leaf spring.

6. The apparatus of claim 4 further comprising:
   a conductive top radial contactor that includes a push-rod; and
   a spring operable to apply force to the push-rod for establishing electrical contact between the conductive top radial contactor and the premetalized non-conductive substrate when the substrate becomes in contact with the spring-loaded compliance mechanism.

7. The apparatus as in claim 6, wherein the top radial contactor as an arc radius that is substantially the same as arc radius of the substrate.

8. The apparatus as in claim 6, wherein the conductive top radial contactor comprises stainless steel.

9. The apparatus as in claim 6, wherein the spring comprises spring-tempered steel wire.

10. The apparatus as in claim 4, wherein the at least one conductive spring-loaded contact comprises BeCu.

11. The apparatus as in claim 4, wherein the at least one conductive spring-loaded contact is approximately 0.005 inch thick and approximately 0.16 inch wide.

12. An apparatus comprising:
    a bias voltage feed through component configured to receive a bias voltage and further configured to apply the bias voltage to a pre-metalized non-conductive substrate when the pre-metalized non-conductive substrate is brought into contact with the apparatus;
    a lift mechanism, wherein
       the lift mechanism is operable move a substrate holder in a first direction to bring the pre-metalized non-conductive substrate into contact with a spring-loaded compliance mechanism, thereby connecting the spring-loaded compliance mechanism through the pre-metalized non-conductive substrate to the lift mechanism, and
       the lift mechanism is operable to move the substrate holder in a second direction to disconnect the pre-metalized non-conductive substrate from the spring-loaded compliance mechanism, thereby disconnecting the spring loaded compliance mechanism from the lift mechanism through the pre-metalized non-conductive substrate.

13. The apparatus as in claim 12, wherein the substrate comprises a glass substrate.

14. The apparatus as in claim 12, wherein the substrate includes a chromium-containing alloy formed on a surface thereof.

15. The apparatus of claim 12, wherein the means for applying force comprises:
    at least one conductive spring-loaded contact for engagement with the pre-metalized non-conductive substrate when the substrate is brought into contact with the apparatus.

16. The apparatus of claim 15, wherein the at least one conductive spring-loaded contact comprises a leaf spring.

17. The apparatus of claim 15 further comprising:
    a conductive top radial contactor that includes a push-rod, and wherein the means from applying force is operable to apply force to the push-rod for establishing electrical contact between the conductive top radial contactor and the premetalized non-conductive substrate when the substrate becomes in contact with the conductive top radial contactor.

18. The apparatus as in claim 12, wherein the top radial contactor has an arc radius that is substantially the same as arc radius of the substrate.

19. The apparatus as in claim 12, wherein the conductive top radial contactor comprises stainless steel.

20. The apparatus as in claim 15, wherein the at least one conductive spring-loaded contact comprises BeCu.

* * * * *